(12) United States Patent
Guerin et al.

(10) Patent No.: US 9,641,157 B2
(45) Date of Patent: May 2, 2017

(54) METHOD AND DEVICE FOR FILTERING DURING A CHANGE IN AN ARMA FILTER

(75) Inventors: Alexandre Guerin, Rennes (FR); Julien Faure, Ploubezre (FR); Claude Marro, Plouguiel (FR)

(73) Assignee: ORANGE, Paris (FR)

( * ) Notice: Subject to any disclaimer, the term of this patent is extended or adjusted under 35 U.S.C. 154(b) by 752 days.

(21) Appl. No.: 14/005,801

(22) PCT Filed: Mar. 14, 2012

(86) PCT No.: PCT/FR2012/050526
§ 371 (c)(1),
(2), (4) Date: Sep. 17, 2013

(87) PCT Pub. No.: WO2012/123676
PCT Pub. Date: Sep. 20, 2012

(65) Prior Publication Data
US 2014/0019504 A1    Jan. 16, 2014

(30) Foreign Application Priority Data
Mar. 17, 2011   (FR) .................................. 11 52198

(51) Int. Cl.
*H03H 21/00* (2006.01)
*H03H 17/02* (2006.01)

(52) U.S. Cl.
CPC .... *H03H 17/0258* (2013.01); *H03H 17/0294* (2013.01); *H03H 21/0032* (2013.01);
(Continued)

(58) Field of Classification Search
CPC ......... G10H 2250/081; H03H 21/0032; H03H 17/0258; H03H 2017/0295
See application file for complete search history.

(56) References Cited

U.S. PATENT DOCUMENTS

| 4,706,291 A | 11/1987 | Kakubo et al. |
|---|---|---|
| 5,698,807 A | 12/1997 | Massie et al. |

(Continued)

FOREIGN PATENT DOCUMENTS

| EP | 2144171 A1 | 1/2010 |
|---|---|---|
| WO | 97/39526 A1 | 10/1997 |

OTHER PUBLICATIONS

L. Sellami and R. W. Newcomb, "Synthesis of ARMA Filters by Real Lossless Digital Lattices", IEEE Trans. Circuits Syst. II, vol. 43, pp. 379-386, 1996.*

(Continued)

*Primary Examiner* — Matthew Sandifer
(74) *Attorney, Agent, or Firm* — David D. Brush; Westman Champlin & Koehler, P.A.

(57) ABSTRACT

A method and device are provided for filtering digital audio signals using at least one ARMA filter, particularly during a filter change. The method includes the following steps: a step of receiving a first request to change filtering to or from filtering by a first ARMA filter; and, in response to the first request, a step of gradually switching, at each of a plurality of cascaded first filtering blocks, between digital-signal filtering by a first basic filtering cell and digital-signal filtering by another associated basic filtering cell, the first basic filtering cells of the plurality of first filtering blocks factorizing the first filter.

15 Claims, 2 Drawing Sheets

(52) U.S. Cl.
CPC ............... *G10H 2250/081* (2013.01); *H03H 2017/0295* (2013.01)

(56) References Cited

U.S. PATENT DOCUMENTS

| | | | |
|---|---|---|---|
| 2005/0210092 A1* | 9/2005 | Ferguson | H03H 17/0258 708/300 |
| 2010/0225419 A1* | 9/2010 | Pan | H03H 15/02 333/174 |
| 2011/0224995 A1* | 9/2011 | Kovesi | G10L 19/24 704/500 |

OTHER PUBLICATIONS

French Search Report dated Nov. 21, 2011 for corresponding French Patent Application No. 1152198, filed Mar. 17, 2011, 3 pages.

International Search Report dated Aug. 17, 2012 for corresponding International Patent Application No. PCT/FR2012/050526, filed Mar. 14, 2012, 7 pages.

International Preliminary Report on Patentability and English Translation of the Written Opinion dated Sep. 17, 2013 for corresponding International Patent Application No. PCT/FR2012/050526, filed Mar. 14, 2012, 8 pages.

Verhelst W. et al.: "A Modified-Superposition Speech Synthesizer and its Application", ICASSP 86 IEEE-IECEJ-ASJ International Conference on Acoustics, Speech and Signal Processing, Tokyo, Japan, Apr. 7, 1986 (Apr. 7, 1986)-Apr. 11, 1986 (Apr. 11, 1986), pp. 2007-2010, XP002663970.

Zetterberg L. H. et al.: "Elimination of Transients in Adaptive Filters with Application to Speech Coding", Signal Processing, vol. 15, No. 4, Dec. 1, 1988 (Dec. 1, 1988), pp. 419-428, XP026672203.

* cited by examiner

METHOD AND DEVICE FOR FILTERING DURING A CHANGE IN AN ARMA FILTER

CROSS-REFERENCE TO RELATED APPLICATIONS

This Application is a Section 371 National Stage Application of International Application No. PCT/FR2012/050526, filed Mar. 14, 2012, which is incorporated by reference in its entirety and published as WO 2012/123676 on Sep. 20, 2012, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The present invention relates to a process for filtering digital signals by means of at least one autoregressive moving averaged filter, otherwise known as ARMA (Auto-Regressive Moving Averaged) and a corresponding device.

It focuses especially on filtering during modification of the ARMA filter over time (switching off or activation for example) or during a change of ARMA filter.

A main field of application is that of digital audio signals.

BACKGROUND OF THE DISCLOSURE

As is known per se, a linear ARMA filter can be represented in the form of a transfer function H(z), in a field of z-transforms linking the input signal X(z) and the filtered output signal Y(z) by:

$$Y(z) = H(z) \cdot X(z) = \frac{b_1 + b_2 \cdot z^{-1} + \ldots + n_{n+1} \cdot z^{-n}}{a_1 + a_2 \cdot z^{-1} + \ldots + a_{m+1} \cdot z^{-m}} \cdot X(z) = \frac{B(z)}{A(z)} \cdot X(z).$$

The polynomial B(z) defines the moving average part (or Moving Average MA) of the ARMA filter, and the polynomial A(z) defines the autoregressive part (AR) of the ARMA filter.

Finite impulse filters (FIR) correspond in the event where the degree m of the polynomial A is zero.

Infinite impulse filters (IIR) correspond in the event where the degree m of the polynomial A is non-zero.

Because ARMA filters vary over time, and IIR filters in particular, they are used for example in sound-editing software for dynamically changing effect (multi-band equalisers, audio effects, etc.), in synthesis solutions (vocal and other) or in processing involving pickup or restoration of sound (reduction or cancellation of noises, whereof the characteristics vary over time).

Modification over time of ARMA filters, and more particularly of IIR filters, does however have disadvantages, mainly with the appearance of transitory artefacts during filter change. These artefacts manifest for example in the form of audio "clicks" particularly unpleasant to hear, and are for example associated with initialisation of internal memories of a new IIR filter to be activated, with dephasing introduced by the current ARMA filter to be switched off, and with potential differences in overall delay (group delay) of the above filters.

Hereinbelow, the description will concentrate mainly on the case of filters of IIR type, linear in particular. In fact, infinite impulse response filters are those for which a filter change conventionally generates the most artefacts. Also, linear filters prove to be much more widespread and studied than non-linear filters. In this way, the explanations hereinbelow could be applied directly in a wide range of classic situations.

Nevertheless, it is understood that the invention can apply to any type of ARMA filter, linear or non-linear, and especially in the case of Volterra filters which are non-linear polynomial filters. The theory of so-called polynomial "Volterra" filters is especially documented in the publication "The Volterra and Wiener theories of nonlinear Systems" (Schetzen, 1989, Ed. Krieger).

Different solutions have already been brought up in techniques of the prior art for trying to limit, or even cancel, the transitory effects linked to internal memories of these IIR filters.

One approach, illustrated by the publication "Elimination of transients in adaptive filters with application to speech coding" by Zetterberg, L. H. and Q. Zhang (1988), is based on initialisation of variables of internal state in internal memories of the new IIR filter to be activated.

For correct initialisation, a sufficient number of samples preceding the moment of IIR filter change is stored, then all these samples are filtered by the new IIR filter. Once initialised, the new IIR filter is applied to the signal.

The authors of this publication have shown that, contrary to theory, it is possible to be content with a reduced number of samples for executing this initialisation, despite the infinite character of the impulse responses of these filters. This number depends directly on the "length of the impulse response" of the new filter, a notion defined by the LONG first samples accounting for x % of the total energy of the filter (the percentage x being determined empirically and according to applications), in the case of a stable IIR filter whereof the impulse response tail tends to 0.

This approach however suffers from complexity and/or latency.

In fact, initialisation of internal variables of the new IIR filter requires filtering of a number of samples N which depends on the LONG length of the impulse response of the filter: in general, it is necessary for N>LONG to avoid any audible artefact.

Given this constraint, two options for execution are considered:

either the internal variables are initialised at the time of IIR filter change, requiring N+1 samples to be filtered: the N samples preceding the current sample and the current sample, though this generates a substantial complexity peak at the instant t of the IIR filter change;

or parallel filtering is carried out with the two filters: the switching between the two filters is done after N samples. This option involves latency of N samples before application of the new IIR filter, meaning that the new filter is applied at the end of these N samples only. The result is a significant hindrance if the aim is to apply the new IIR filter to the signal (for example for cancelling a particular signal) as fast as possible or again change IIR filter before the end of the N samples.

These disadvantages are also there in the case of simple deactivation (switching off) of the current IIR filter (in this case, the "new filter" can be seen as an "identity filter"

letting everything pass through), since the current IIR filter introduces dephasing in the filtered signal, the origin of audio "clicks" when the filter is switched off suddenly.

Finally, this approach fails to protect against differences in delay (group delay) between the two IIR filters: if the two filters have a different group delay, this inevitably becomes an audible artefact ('click' type) linked to discontinuity of the signal.

A hybrid approach has also been covered in the publication "A modified-superposition speech synthesizer and its applications" by Verhelst, W. and P. Nilens (1986).

This approach uses a "vanishing technique" consisting of instantiating the two IIR filters in parallel at the time of switching from one filter to the other, with the following configuration: the new IIR filter, non-initialised, receives the signal to be filtered whereas the former IIR filter "switches off" (by vanishing) and receives no input.

The filtered output is constituted by the sum of the outputs of each of the two IIR filters, a sum formed during a limited period N. In practice, the "interpolation" time N (the duration of mixing of the outputs) necessary for having no audio artefact is greater than the LONG lengths of the impulse responses of the two IIR filters.

This hybrid approach relates to the second execution option mentioned hereinabove for the approach with initialisation of internal memories. In fact, use is also made of two IIR filters operating in parallel.

The difference however is in the instantaneous transition between the two IIR filters, made possible due to mixing the two outputs (rather than switching instantaneously from an output of one filter to the other after a certain time in the second option hereinabove). This limits the artefacts linked to differences in group delay between the IIR filters.

However, this hybrid approach also suffers from other disadvantages mentioned previously, and especially from latency due to the interpolation duration which must remain greater than the LONG effective length of the impulse response of the IIR filters.

SUMMARY

For this purpose, the invention relates especially to a filtering process of a digital signal by means of at least one ARMA filter, comprising a receiving step of a first request for filtering change to or from filtering by a first IIR filter, characterised in that it comprises, in response to said first request, a progressive switching step, at the level of each of a plurality of cascaded first filtering blocks, between digital signal filtering by a first elementary filtering cell originating from factorisation of the first filter and digital signal filtering by another associated elementary filtering cell, and wherein all of said first elementary filtering cells of the plurality of first filtering blocks factorise said first ARMA filter.

In particular, progressive switching can allow reverse navigating between the first elementary cells and the other elementary filtering cells for example for moving from filtering only by the first ARMA filter or RM (that is, by the first elementary cells) to filtering by the other elementary cells (using for example another ARMA filter or IIR or an identity filter representative of the absence of filtering).

The factorisation of an ARMA filter, and especially IIR, extends from breakdown of the filter to elementary filtering cells whereof all the transfer functions correspond to factorisation of the transfer function of said ARMA filter.

Progressive filtering switching extends from one filtering pass to another, during which the two filtering events are executed together and combined at least temporarily, that is, for a non-zero instant (corresponding, in a processing technique of a digital signal, to at least one sample). In other terms, during this progressive switching phase the two filtering events contribute in part to the output value of the filtered signal by a filtering block.

The present invention offers performances improved relative to techniques of the prior art, and especially reduced latency, due in particular to clearly reduced initialisation time of the internal variables or phasing time of the filters. In fact, in the first case, the interpolation duration necessary for avoiding audio artefacts itself is reduced.

This situation results from carrying out, according to the invention, factorisation of the ARMA filter or ARMA filters (or IIR) used in a plurality of elementary filtering cells within filtering blocks, and a control, at the level of each of the latter, of switching between filters.

In fact, due to factorisation, the MA and AR filters of the elementary filtering cells are of orders less than the corresponding MA and AR filters of the original ARMA filter (that is, the corresponding polynomials A and B in the transfer functions are of lesser degrees). The initialisation time of the internal variables of filters of inferior order is clearly shorter than that of a complete ARMA filter. The reduced initialisation time is obtained by progressive filtering switching at the level of each of the elementary filtering cells (of inferior order) during activation of the corresponding ARMA filter.

The same applies during simple switching off of the current ARMA filter.

The present invention enables increased reactivity, for example when a new filter must be instantiated rapidly in response to an unforeseen acoustic event. This is especially the case when the aim is to cancel a signal which appears suddenly (a pure sound, a multifrequency signal with two tonalities or DTMF, etc.) and/or whereof the temporal/spectral characteristics vary rapidly over time.

It shall be noted that dynamic switching from or to an ARMA filter can thus be done instantaneously by applying a switching operation to the output of each elementary filtering cell which then serves as input of the following elementary cell (due to the cascading of said first filtering blocks).

Also, due to faster initialisation, any peak in complexity at the instant the switching linked to the simultaneous instantiation of two filters is clearly reduced.

During progress from the state wherein the digital signal is filtered before switching (therefore either only by the first elementary filtering cells factorising the first ARMA filter, or by the other elementary cells representing another filter, "identity" or not) to the state wherein the digital signal is filtered after switching (therefore by the other elementary cells or by the first elementary cells), the filtered output signal of each filtering block combines a signal filtered by the first elementary cell and a signal filtered by the other associated elementary cell. For example, progressive switching at the level of a first filtering block comprises the combination, at least temporary, of a filtered signal by the first elementary filtering cell with a filtered signal by the other associated elementary filtering cell to produce a mixed output signal of filtering block during progressive switching.

In other words, the signals filtered by a first elementary cell and by the elementary cells with which is associated are mixed, that is, combined within the same filtered signal. Mixing guarantees smoothing of the transition between the filtering states, and consequently contributes to attenuation, or even cancelling, of audible artefacts during such transition.

Therefore, a filtering block can employ an adder (or mixer) which adds contributions resulting from the filtering outputs of the two elementary cells of the block. As will become evident hereinbelow, the switching control means can be varied, for example by varying the contributions of each elementary cell by application of a progressive switching coefficient to their output signal, or by acting directly on the input signal of these elementary cells or by application of a similar switching coefficient (for example in the case of linear cells), or by use of an interrupter shunting the signal to be filtered to one or the other of the elementary cells of the block. In the latter case especially, the elementary filtering cell which is disconnected by the interrupter continues to supply an output signal due to the time of impulse response, ensuring a kind of mixing of output signals of the two elementary cells of the block at the level of the adder. Progressive switching is therefore carried out.

In an embodiment, said progressive switching can use fades whereof the corresponding fade coefficients are applied to the signals filtered by the first elementary filtering cells and by the other elementary filtering cells, typically reverse fades, one closing and the other opening, within the same first filtering block.

The opening fade and the closing fade are also known by the English terms "fade-in" and "fade-out", designating progressive increase and progressive decrease in the amplitude of a signal. So, applying fade at the same time to all the first elementary filtering cells progressively switches off the first ARMA filter (closing fade of these elementary cells) or it is activated progressively (opening fade), retaining the approach by elementary cell enabling fast initialisation of internal variables.

Similarly, filtering resulting from the cascading of associated elementary filtering cells in the filtering blocks (corresponding to another ARMA filter or an "identity" filter for example) is also activated or switched off progressively, in reverse order to the first ARMA filter.

By way of variant, switching can be immediate, for example by application of the above "vanishing technique". But progressive switching, "fade-in/fade-out" type, limits the appearance of audible artefacts, and switches more rapidly from one ARMA filter or IIR to the other, with "constant" artefact.

According to a particular characteristic, fades applied to the signals filtered by the first elementary filtering cell and by the other elementary filtering cell of the same first filtering block are reverse fades, one opening and the other closing, the corresponding fade coefficients of which vary over time.

Fade coefficients represent a mixing coefficient between the two signals, representative of mixing according to the fade-in/fade-out function. This arrangement shows that the ARMA filter change combines a set of switching events at the level of each filtering block. It will be ensured preferably to conduct simultaneous switching, and optionally with the same mixing coefficient, for all the filtering blocks. However, other uses are feasible within the scope of the present invention, such as application of different fade coefficients (in form and/or duration) from one filtering block to the other, or even in a given filtering block, between said first elementary cell and the associated elementary cell.

According to a configuration of the invention, within each first filtering block, said other elementary filtering cell is placed in parallel with said first elementary filtering cell to which a switching coefficient is applied, and said other elementary filtering cell uses an identity filter weighted by a complementary switching coefficient. This configuration simply uses a control mechanism of the simple activation or simple switching off of said first ARMA filter. In fact in this case, in the absence of activation of the latter (therefore either prior to switching or after the latter), only cell identity filters are cascaded, ensuring that an overall filter identity is acquired, that is, no modifying filtering.

In this configuration, the first elementary filtering cell and the cell "identity" filter in parallel receive the same digital signal at input (that of output of a preceding filtering block). They also supply a common output signal combined by means of a mixing coefficient (fade coefficients such as mentioned earlier also) whereof the component assigned to the cell "identity" filter (the switching coefficient) is reverse or complementary to the (fade) coefficient assigned to the first associated elementary filtering cell.

This complementarity can be linked to the above mixing coefficient which specifies the degree of progressiveness in switching. It also relates to the fact that the contributions of the first elementary filtering cell and of the cell "identity" preferably must not introduce useless attenuation or amplification of the digital filtered signal. In this case, the sum of the two coefficients applied to the first elementary cell and to the parallel cell "identity" filter could be equal to 100% (amplitude average), or the sum of their squares could be equal to 100% (energy average). Of course, other scenarios of complementarity between the applied coefficients are also feasible.

In a particular embodiment, two broken down ARMA filters, each of filtering blocks of elementary cells described previously, can be placed in series to switch from one to the other. In this case, said plurality of first filtering blocks is placed in series of a plurality of second cascaded filtering blocks, each comprising a second elementary filtering cell originating from factorisation of a second ARMA filter placed in parallel with a cell identity filter and weighted by a switching coefficient, all the second elementary filtering cells of the plurality of second filtering blocks factorising the second ARMA filter, and at the level of the second filtering blocks the process comprises progressive switching of reverse filtering by the second elementary cells of the progressive filtering switching by the first elementary cells at the level of the first filtering blocks to control progressive switching between filtering by the first ARMA filter and filtering by the second ARMA filter.

Therefore, switching between two ARMA filters is managed in modular fashion by placing corresponding filtering blocks in series decomposing the preferred ARMA filters, and by navigating them in reverse.

According to another configuration of the invention, the two IIR filters broken down in elementary cells can be instantiated in parallel. In this case, within said first filtering blocks, said other elementary filtering cell is placed in parallel with said first elementary filtering cell and comprises a second elementary filtering cell originating from factorisation of a second ARMA filter.

When placed in parallel, the first and second elementary filtering cells of a filtering block receive and filter the same digital input signal of the filtering block (corresponding to the output signal of the upstream filtering block), and their filtered signals can be combined given switching from one to the other (that is, in practice as a function of a mixing coefficient, for example) to generate the filtered output signal of the relevant filtering block.

In particular, if one of the factorisations of the first and second ARMA filters comprises more elementary filtering cells than the other, a cell filter of identity filter type is associated with each supernumerary elementary filtering cell to form said filtering block. This arrangement effectively deals with the case of ARMA filters not having the same order (for the MA or AR part, for example).

Since switching is progressive, it is not rare for a new request for change of ARMA filter to arrive while switching is incomplete, that is, while the two filtering events within a filtering block each contribute in part to the output signal of the latter.

Therefore, according to an embodiment of the invention, in response to a second request for reverse filtering change of the first request (that is, returning to filtering as it was before the start of said switching) and received during progressive switching, it can be provided to reverse said filtering switching from the switching state corresponding to the instant of reception of said second request for change. This inversion can be realised by reversing applied fade coefficients, or by reversal between increase and decrease of applied fade coefficients, from their respective values at the time of receipt of the new request.

This arrangement keeps the internal memories of the filters unchanged and prevents discontinuities in the audio signal (generating unpleasant artefacts), while processing of the new request is not delayed. It is particularly useful for some audio applications wherein the same filter is regularly deactivated and reactivated (for example, for low-volume acoustic shocks where the activation decision can be unstable).

In another embodiment of the invention, in response to a third request for change of ARMA filter to a new ARMA filter received during said progressive switching, the process also comprises a progressive switching step, at the level of each first filtering block, between digital signal filtering by said first filtering block in the state corresponding to the instant of reception of said third request and digital signal filtering by a new elementary filtering cell originating from factorisation of said new ARMA filter.

The progressive combination of fade-in/fade-out type can be done between output of an elementary cell of the third ARMA filter and output of a filtering block in the state it was in during reception of the new request for change of ARMA filter. It is thus easy to modularly and recursively integrate a large number of ARMA filters while they are activated while the preceding transition (preceding switching) is not complete.

The resulting filtering is smoothed despite the large number of ARMA filter changes.

According to an embodiment of the invention, the first and second elementary filtering cells are filters of the first or second order. The order of a filter, and therefore of the elementary filtering cells, is especially the greatest of degrees of the polynomial numerator and denominator constituting their transfer function. As a result, initialisations of the internal variables to each elementary cell are last much less than conventional techniques for a complete ARMA filter. As a consequence, this arrangement ensures brief switching time between the two ARMA filters.

In particular, the first and second elementary filtering cells are filters of the first or second order with real coefficients. This arrangement has factorisation operations, that is, breakdown operations of the ARMA filter in elementary filtering cells, which employ only slightly complex calculations.

According to a particular characteristic, the first and second elementary filtering cells are filters of the first order resulting from breakdown in lattice of the first and second ARMA filters. Using filters of the first order ensures minimal initialisation time of the internal variables and therefore of switching between ARMA filters.

As a variant, the first and second elementary filtering cells are filters of the second order. This arrangement offers less complexity (fewer elementary cells to be instantiated) and retains very short initialisation times.

Correlatively, the invention relates to a device for filtering a digital signal by means of at least one ARMA filter, comprising:
  a plurality of cascaded first filtering blocks, each comprising a first elementary filtering cell and another associated elementary filtering cell, all of said first elementary filtering cells of the plurality of first filtering blocks factorising a first ARMA filter;
  at least one control element for controlling, at the level of each first filtering block, a filtering change in response to a first request for filtering change to or from filtering by the first ARMA filter, and
  each so-called first filtering block is configured to operate the filtering change by progressive switching between digital signal filtering by the first elementary filtering cell and digital signal filtering by said other associated elementary filtering cell.

Software, material or hybrid implementation of filters digital is known per se. The device according to the invention can be used for software, equipment or hybrid.

The device according to the invention has advantages similar to those of the process explained hereinabove, especially for reducing latency during change of ARMA filter.

Optionally, the device can comprise means relating to the characteristics of the process mentioned earlier.

In an embodiment, each so-called first filtering block comprises an adder for at least temporarily combining a filtered signal by the first elementary filtering cell with a signal filtered by said other associated elementary filtering cell to generate a mixed filtering block output signal during progressive switching. In another embodiment, the at least one control element comprises progressive attenuation means of the filtered signal by the first elementary filtering cell and of the filtered signal by said other associated elementary filtering cell prior to combination, according to respectively two complementary fade coefficients, one closing fade and the other opening fade.

According to a configuration of the invention, within each first filtering block, said other elementary filtering cell is placed in parallel with said first elementary filtering cell to which a switching coefficient is applied and said other elementary filtering cell uses an identity filter weighted by a complementary switching coefficient.

In particular, in "series" usage, said plurality of first filtering blocks is placed in series of a plurality of cascaded second filtering blocks, each comprising a second elementary filtering cell originating from factorisation of a second ARMA filter placed in parallel with a cell identity filter and weighted by a switching coefficient, all of said second elementary filtering cells of the plurality of second filtering blocks factorising the second ARMA filter, and
  at the level of the second filtering blocks the device comprises control elements of progressive filtering switching by the reverse second elementary cells of the progressive filtering switching by the first elementary cells at the level of the first filtering blocks to control progressive switching between filtering by the first ARMA filter and filtering by the second ARMA filter.

According to a "parallel" configuration, within said first filtering blocks said other elementary filtering cell is placed in parallel with said first elementary filtering cell and comprises a second elementary filtering cell originating from factorisation of a second ARMA filter.

Especially, if one of the factorisations of the first and second ARMA filters comprises more elementary filtering cells than the other, a cell filter of identity filter type is associated with each supernumerary elementary filtering cell to form a so-called filtering block.

The invention also relates to means of storing information comprising instructions for a computer adapted to execute the filtering process according to the invention when this program is loaded and run by a computer system.

The invention also relates to a computer program readable by a microprocessor, comprising instructions for executing the filtering process according to the invention when this program is loaded and run by the microprocessor.

The means for storing information and computer program have characteristics and advantages similar to the processes which they conduct.

BRIEF DESCRIPTION OF THE DRAWINGS

Other particular features and advantages will emerge from the following description, illustrated by the attached diagrams, in which.

DETAILED DESCRIPTION OF ILLUSTRATIVE EMBODIMENTS

Examples for the present illustration are two digital linear filters with infinite impulse response or "IIR filters" or "recursive filters", designated $h_1$ and $h_2$, both having the same even order, designated L, for their respective parts MA and AR.

The invention naturally also applies to other cases of ARMA and IIR filters.

For example, it applies to non-linear filters (especially Volterra filters), to FIR filters, and also in the event where both IIR filters $h_1$ and $h_2$ have non-even and/or different orders, or in the event where for the same IIR filter $h_1$ or $h_2$ the parts MA and AR also have non-even and/or different orders. The expert will be able to adjust the following explanations to these different cases by obtaining for example a cell of the first order as a complement to cells of the second order, or by obtaining elementary filtering cells whereof the denominator or the numerator is a constant while the associated numerator or denominator is a polynomial of a degree at least equal to 1. In particular, the above publication "The Volterra and Wiener theories of nonlinear Systems" provides indications on obtaining factorisation of a non-linear system of elementary cells.

As is known per se, linear IIR filters $h_i$, (i=1 or 2) are defined by the z-transform $$H_i(z) = \frac{B_i(z)}{A_i(z)} = G \cdot \frac{\prod_{l=0}^{\frac{L}{2}-1}(1-\beta_{i,l} \cdot z^{-1})(1-\overline{\beta_{i,l}} \cdot z^{-1})}{\prod_{l=0}^{\frac{L}{2}-1}(1-\alpha_{i,l} \cdot z^{-1})(1-\overline{\alpha_{i,l}} \cdot z^{-1})},$$

where $H_i(z)$ is the z-transform of the filter $h_i$, G is the gain of the filter $H_i$, and $\alpha_{i,l}$ and $\beta_{i,l}$ are complex coefficients.

The transfer function $H_i(z)$ can also be factorised in cells of the second order as follows:

$$H_i(z) = \frac{B_i(z)}{A_i(z)}$$

$$= \frac{\prod_{l=0}^{\frac{L}{2}-1}(b_{i,l,0} + b_{i,l,1} \cdot z^{-1} + b_{i,l,2} \cdot z^{-2})}{\prod_{l=0}^{\frac{L}{2}-1}(1 - a_{i,l,1} \cdot z^{-1} - a_{i,l,2} \cdot z^{-2})}$$

$$= \prod_{l=0}^{\frac{L}{2}-1} h_i^l(z),$$

where $a_{i,l}$ and $b_{i,l}$ are real coefficients.

These formulae show how an IIR filter $h_i$ can be factorised in cells of the first order and/or in cells $h_i^l$ (l=0 . . . L/2−1) of the second order, that is, its transfer function is broken down into a product of polynomial cells of the second degree. The first IIR filter $h_1$ is factorised in a plurality of a first elementary filtering cells $h_1^l$ and the second IIR filter $h_2$ is factorised in a plurality of second elementary filtering cells $h_2^l$.

It is evident here that the above generalisation on any IIR filter of any dimensions is immediate, given that any filter can be factorised as a ratio of products of cells of the first and of the second order with real coefficients (lattice breakdown, into cells of the second order).

According to the invention, any other breakdown with cells of greater orders (than the second order) can also be used, if necessary. However, breakdown into cells of the real first and of the second order will be preferred, since the less complex corresponding calculations contribute to better optimisation of the invention.

Note x(n) the digital audio signal to be filtered (X(z) its z-transform) and y(n) the resulting filtered signal (Y(z) its transform), n being the sample index.

The aim of the present invention is managing the filtering during an IIR filter change: for example, activation of an IIR filter in the previous absence of filtering; switching off an IIR filter for the sake of absence of filtering; shifting from one IIR filter to a new IIR filter (as described hereinbelow) or to a modified version of the same current filter.

Such a change can be requested by an operator via a user interface, or by another system (for example noise reduction software). In these various instances, a command for IIR filter change is received.

Reference is made to the example of deactivation of an IIR filter $h_2$, current for activation of a second filter. In other terms, this is the filter change $h_1$ in $h_2$ at time T:

$$y(n) = \begin{cases} x(n) * h_1, & \forall n < T \\ x(n) * h_2, & \forall n \geq T \end{cases}.$$

The other examples derive smoothly from this example: for example, taking "identity" filters (H(z)=z) for $h_1$ or $h_2$ to respectively illustrate simple activation of $h_2$ or simple switching off of $h_1$.

Figure 1:
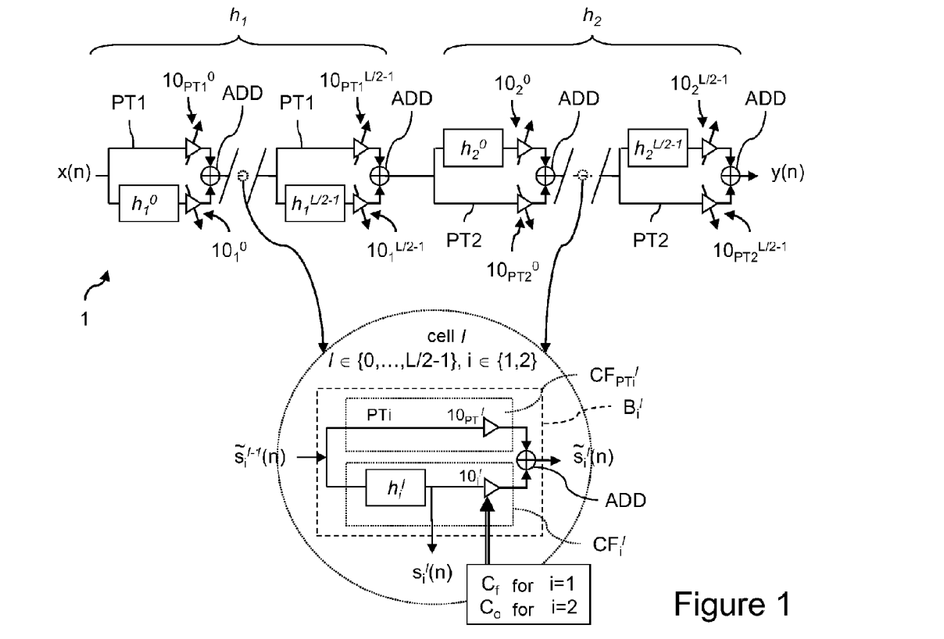
FIG. 1 schematically illustrates a first embodiment of the invention.

FIG. 1 schematically illustrates a first embodiment of the invention for managing this switching at the time T from the filter $h_1$ to the filter $h_2$. The elementary filtering cells shown in this figure, and the associated control elements can easily be implemented via software and/or material elements.

This first example corresponds to a filtering device 1 implementing "in series" the filters $h_1$ and $h_2$. As emerges from the figure, each filter $h_i$ constitutes a "block" which is easy to handle to be connected in series to another "block" representing another IIR filter. Therefore, it is easy to "connect" in series or substitute any filter to another filter, for the purpose of executing the present invention.

In this configuration, each filter $h_i$ is constituted by the cascading of elementary filtering $h_i^l$ cells which break it down. l is an index of elementary filtering cells depending on completed breakdown. For example, for breakdown into elementary cells of the first order only, L cells are obtained and the index l varies from 0 to L−1. Similarly, for breakdown into elementary cells of the second order only, L2 cells are obtained and the index l varies from 0 to L/2−1.

Associated with each elementary filtering cell $h^1_1$ at output is a control element $10_i^l$, for example a potentiometer module for applying an attenuation factor or "fade coefficient" to the signal filtered by $h_1^l$. The whole of these two elements is called cell filter $CF^l_i$. It should be noted that in software usage, this control element can consist of a fade coefficient applied directly to the signal leaving the corresponding elementary filtering cell.

As emerges from the following explanations, a cell filter $CF^l_i$ comprises an elementary filtering cell and an associated control element for filtering an input signal. According to different configurations, the control element can be placed after the elementary cell or before the elementary cell.

In the case of placement after the elementary cell (in FIGS. 1 and 3 for example), this control element cannot be simple instantaneous switching of interrupter (or switch) type but offers progressive transition (fade type, especially).

In the case of placement before the elementary cell (as in FIG. 4, for example), this control element can prove to be a simple interrupter. In fact, the impulse response time of the elementary cells (these cells have a "memory") ensures non-zero contribution of these "disconnected" cells at the level of corresponding adders, and therefore progressive switching according to the invention at the level of each filtering block. With a control element of progressive type (fade coefficient for example), this contribution due to "memory" is also modified by the fade coefficient applied by the control element.

In the example of FIG. 1, the control element uses a fade in/fade out function during switching between the two filters $h_1$ and $h_2$.

The control elements $10^l_1$ controlling the first elementary filtering cells $h_1^l$ are preferably identical, simultaneously applying the same closing fade coefficient $C_f$ during switching to the IIR filter $h_2$ (for example progressively from 100% to 0%).

The control elements $10^l_2$ controlling the second elementary filtering cells $h_2^l$ are preferably identical, simultaneously applying the same opening fade coefficient $C_o$ during the same switching (for example progressively from 0% to 100%). In particular, the opening fade coefficient $C_o$ can be complementary to the closing fade coefficient $C_f$, that is, for example $C_o + C_f = 100\%$. It should be noted that the ratio $C_o/C_f$ is designated a mixing coefficient.

Also, each cell filter $CF^l_i$ (that is, an elementary filtering cell and its associated control element $10^l_i$ is placed in parallel with a cell "identity" filter $CF^l_{PTi}$ composed by an elementary filtering cell of "identity" PTi type (that is, letting everything pass through, represented symbolically by a dotted line in the figure) and an associated control element $10^l_{PTi}$ of the same type as the control elements $10^l_i$. This placing in parallel consists of applying the same input signal to the two elementary cells and acquiring an output signal adding up the respective output signals of each cell filter $CF^l_i$ and $CF^l_{PTi}$.

The two cell filters $CF^l_i$, $CF^l_{PTi}$, therefore receive the same input signal $\tilde{s}_i^{l-1}(n)$ and respectively generate a filtered output signal to an adder ADD (or mixer). The latter adds the two acquired filtered signals to generate a filtered output block signal. During progressive switching, this output block signal mixes the two filtered signals, the intensity of the contribution of each elementary filtering cell $h^l_i$, PTi being a function of the fade coefficient applied by the associated control element $10^l_i$, $10^l_{PTi}$.

The "filtering block" $B^l_i$ is called the unit constituted by the two filter cells $CF^l_i$, $CF^l$ and by the adder ADD. A filtering block therefore receives an input signal to be filtered and generates a filtered output signal which is the input signal filtered by one of the two elementary filtering cells $H^l_i$ or PTi in a period of stabilised operation (permanent state) or which is, during progressive switching (transitory state), a combination (mixing) of the input signal filtered respectively by each of the two elementary filtering cells. According to the positioning of the control element in the filter cells, the degree of contribution of the filtering from each of the elementary cells is a function of the applied switching coefficients and/or of the "memory" (impulse response) of these elementary cells.

In detail, the control element $10^l_{PTi}$ is complementary to the control element $10^l_i$: the control elements $10^l_{PT1}$ implement the opening fade coefficient $C_o$, while the control elements $10^l_{PT2}$ implement the closing fade coefficient $C_f$. In other terms, each branch PT1 behaves relative to the fade coefficient as a cell filter $CF^l_2$ of the second IIR filter (vice and versa for PT2 and the filter cells $CF^l_1$.

In the case of breakdown of the IIR filters into elementary cells of the second order, there is $s_i^l(n)$ with $$\left(i \in \{1; 2\}, l \in \left\{0, \ldots, \frac{L}{2} - 1\right\}\right)$$

the output (filtered signal) of each elementary filtering cell $h_i^l$ and $\tilde{s}_i^l(n)$ the output of the filtering block $B^l_i$ that is, the result of output mixing of the signal passing through the cell filter $CF^l_i$ with the signal passing through the cell filter $CF^l_{PTi}$ ("identity") in parallel.

These outputs are shown as follows for the filter $h_1$:

$$s_1^l(n) = \sum_{k=0}^{2} b_{1,l,k} \cdot \tilde{s}_1^{l-1}(n-k) + \sum_{k=1}^{2} a_{1,l,k} \cdot s_1^l(n-k)$$

Figure 2:
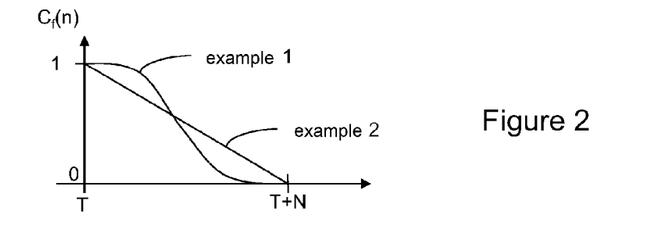
FIGS. 2, 2a and 2b illustrate operating examples of fade out carried out in the progressive change of IIR filters according to the invention.

-continued $$\tilde{s}_1^l(n) = \begin{cases} s_1^l(n) = \tilde{s}_1^{l-1}(n) * h_1^l & n < T \\ C_f(n-T) \cdot s_1^l + (1 - C_f(n-T)) \cdot \tilde{s}_1^{l-1}(n) & T \le n < T+N \\ \tilde{s}_1^{l-1}(n) & n \ge T+N \end{cases}$$

with the convention $\tilde{s}_1^{-1}(n)$ (input signal) and where the fade coefficient $C_f(n)$ is a function of fade out generally decreasing and monotone (examples shown in FIG. 2) and $C_o=1-C_f$ in this example.

N designates the switching duration between the two IIR filters. It can be determined empirically or by experimentation and is selected less than the initialisation durations of the techniques of the prior art. N can be selected as equal to a LONG value such as defined previously but calculated for one of said elementary filtering cells, for example the biggest length covering 80% of the energy of an impulse response (infinite) among all the elementary filtering cells.

Correspondingly, the outputs relating to the filter $h_2$ are shown as follows, for $C_o=1-C_f$:

$$s_2^l(n) = \sum_{k=0}^{2} b_{2,l,k} \cdot \tilde{s}_2^{l-1}(n-k) + \sum_{k=1}^{2} a_{2,l,k} \cdot s_2^l(n-k)$$

$$\tilde{s}_2^l(n) = \begin{cases} \tilde{s}_2^{l-1}(n) & n < T \\ (1 - C_f(n-T)) \cdot s_2^l + C_f(n-T) \cdot \tilde{s}_2^{l-1}(n) & T \le n < T+N \\ \tilde{s}_2^l(n) = \tilde{s}_2^{l-1}(n) * h_2^l & n \ge T+N \end{cases}$$

with the input signal convention $$\tilde{s}_2^{-1}(n) = \tilde{s}_1^{\frac{L}{2}-1}(n).$$

It should be noted that if in this example the same fade coefficient $C_f$ (via $C_o=1-C_f$) is applied to $h_2$ as for the filter $h_1$, the latter can be replaced by a different fade coefficient $C_f'$ corresponding to a function similar to $C_f$ but the temporal support and the form whereof can be different.

Also, the invention also applies if the second IIR filter $h_2$ is placed in front of the first filter $h_1$ (contrary to the figure).

In steady state before the instant T, the input signal $x(n)$ is filtered only by the IIR filter $h_1$:

$$y(n) = \tilde{s}_s^{L/2-1}(n) = \tilde{s}_1^{L/2-1}(n) = \tilde{s}_1^{L/2-2}(n) * h_1^{L/2-1} = \tilde{s}_1^{-1}(n) * h_1^0 * \ldots * h_1^{L/2-1} = x(n) * h_1.$$

This corresponds to a configuration of the device 1 wherein the coefficient $C_f=100\%$ and the coefficient $C_o=0\%$. In fact, the signal $x(n)$ is successively filtered by each of the first elementary filtering cells $h_1^l$, then passes through the second part of the device via the "identity" branches PT2. The contributions of the branches PT1 and $h_2^l$ are not considered due to the coefficient $C_o=0\%$.

At the instant T, switching between the two IIR filters $h_1$ and $h_2$ begins for a period N.

In the present embodiment of the invention, the principle is to progressively switch off the first IIR filter $h_1$ by progressively reducing the coefficient $C_f$ (and by increasing $C_o$ complementarily so that the input signal passes progressively through the "identity" branches PT1. This progressive reduction is conducted via fade out.

Similarly, the second IIR filter $h_2$ is progressively lit by increasing $C_o$ complementarily to $C_f$ (this is for example fade in), progressively diminishing the signal passing through the branches PT2.

In other terms, during the N switching samples the digital signal is filtered by the two IIR filters $h_1$ and $h_2$, their respective contributions varying according to $C_f$.

For each pair ($H_1^l$, $H_2^l$), $\forall l$, switching at the level of the elementary cells consists of progressively decreasing the contribution of the elementary filtering cell coming from the first IIR filter $h_1$ for the sake of contribution of the other elementary cell of the pair (coming from the IIR filter $h_2$).

In each filtering block $B_i^l$ this switching consists of progressively decreasing the contribution of the first elementary filtering cells $h_1^l$ (respectively cell "identity" filters $CF_{PT2}^l$) to the benefit of the contribution of associated cell "identity" filters $CF_{PT1}^l$ (respectively the second elementary filtering cells $h_2^l$).

According to the invention, this switching control is undertaken at the level of each filtering block (and of each elementary filtering cell) by means of appropriate means controlling the coefficients $C_o$ and $C_f$ applied by the control elements $10_i^l$ and $10_{PTi}^l$. Therefore during these N samples, as a filtered output signal for each filtering block $B_i^l$, for example the barycentre of the output signal of the preceding block (via the connection PTi) is calculated with the result of this signal filtered by the elementary filtering cell $h_i^l$ respectively affected by a fade coefficient ($C_f$ for the elementary cells of $h_1$, and $C_o=f(C_f)$ for example $C_o=1-C_f$ for the elementary cells of $h_2$) and of the complementary coefficient. These coefficients favour signals filtered by $h_1$, at the start of switching ($C_f$ close to 1), and favour signals filtered by $h_2$ on completion of switching ($C_f$ close to 0).

On completion of switching ($n \ge T+N$), the digital signal $x(n)$ is filtered by the IIR filter $h_2$ only. In fact, $C_f=0$ and therefore:

$$y(n) = \tilde{s}_2^{L/2-1}(n)$$
$$= s_2^{L/2-1}(n)$$
$$= \tilde{s}_2^{L/2-2}(n) * h_2^{L/2-1}$$
$$= \tilde{s}_2^{-1}(n) * h_2^0 * \ldots * h_2^{L/2-1}$$
$$= \tilde{s}_1^{L/2-1}(n) * h_2$$
$$= \tilde{s}_1^{-1}(n) * h_2$$
$$= x(n) * h_2$$

The first IIR filter $h_1$ is no longer being used. It can be deactivated such that only the second IIR filter $h_2$ is retained to continue processing. Fresh switching of the latter to another filter can be done by applying the ideas of the invention again with the breakdown of this other filter in series (in this case the coefficient $C_o$ applied to the elementary cells $h_2^l$ becomes a closing fade coefficient $C_f$).

It is not rare, during switching from one IIR filter to another, for a new request for IIR filter change to arrive while switching is incomplete. The new request arrives for example at the time $T_1$ with $T<T_1<T+N$.

This can be a request for switching back to the first IIR filter $h_1$.

In this case, it can be provided that in response the filtering switching is reversed from the switching state at the time when this new request is received.

Figure 2A:
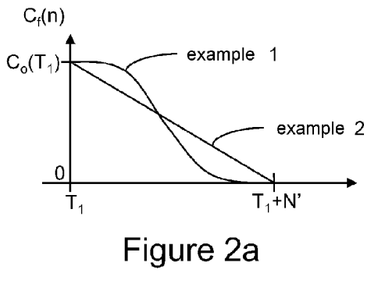

For example, if at this instant $T_1$ the coefficients $C_f(T_1)$ are applied to the filter $h_1$ and $C_o(T_1)$ to the filter $h_2$, reversing switching consists of applying a new closing fade coefficient $C_f$ to the filter $h_2$ and a new opening fade coefficient $C_o$ to the filter $h_1$, substantially taking the form of FIG. 2 (over a period N' which can be equal or different to N), but with values of equal origin, respectively, at $C_o(T_1)$ and $C_f(T_1)$ (FIG. 2a).

Reprising these values at origin ensures the absence of discontinuity in the filtered signal, and therefore of audible artefacts.

Figure 2B:
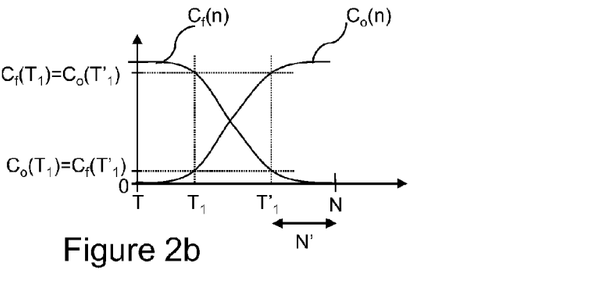

In a variant reducing return time to the filtering state by $h_1$ the profile of the applied fade coefficients can be retraced in the reverse direction. In the case for example of a symmetrical profile, this can correspond to being placed instantaneously at the time $T'_1$ and to applying the end of the coefficient profile of FIG. 2 and reversing $C_f$ (applied to $10^l_1$ and $10^l_{PT2}$) and $C_o$ (applied to $10^l_1$ and $10^l_{PT2}$), with $C_f(T'_1)=C_o(T_1)$ and $C_o(T'_1)=C_f(T_1)$ to avoid any discontinuity (FIG. 2b). In particular with $C_o=1-C_f$, $T'_1=N'=T_1-T$, and the transition duration for returning to filtering by $h_1$ is $N'=T_1-T$.

It can also be a request for selecting a new (third) IIR filter $h_3$. Breakdown of the latter similar to those for the filters $h_1$ and $h_2$ is carried out to acquire third elementary filtering cells $$h_3^l: H_3(z) = \prod_{l=0}^{\frac{L}{2}-1} h_3^l(z).$$

In this case, it can be provided in response to the new request that fresh filtering switching is carried out from the switching state at the time when this new request is received. For this, the mixing state of the instant $T_1$ is fixed (that is, the coefficients $C_f(T_1)$ and $C_o(T_1)$ and all of the first and second IIR filters $h_1$ and $h_2$ are considered as a single filter (designated $h_{12}$) having this fixed state, in series of which the new filter $h_3$ is placed (for example within filtering blocks placed in series of the filtering blocks comprising $h_{12}$).

The preceding ideas are applied to the filters $h_{12}$ (starting filter) and $h_3$ (end filter), especially the presence of associated cell "identity" filters in parallel of each elementary cell of $h_{12}$ and $h_3$, as well as new closing fade coefficients $C'_f$ (for $h_{12}$) and opening $C'_o$ (equal to $1-C'_f$, for $h_3$).

It should be noted that to simplify execution, the coefficient $C'_o$ is applied to each elementary filtering cell $h^l_3$ (via control elements $10_3^l$) and the coefficient $C'_f$ at fixed values $C_f(T_1)$ and $C_o(T_1)$ is applied to the control elements $10^l_i$, already existing for filters $h_1$ and $h_2$.

Figure 3:
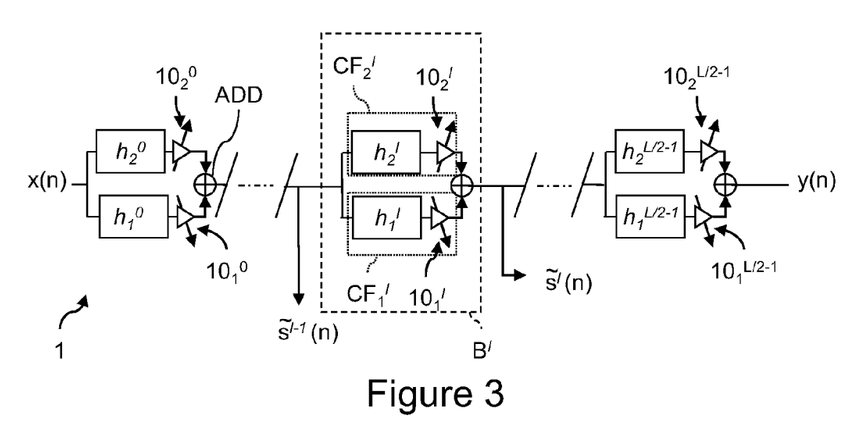
FIG. 3 schematically illustrates a second embodiment of the invention.

FIG. 3 schematically illustrates a second embodiment of the invention for managing this switching at the time T of the filter $h_1$ to the filter $h_2$. The elementary filtering cells shown in this figure, as well as the associated control elements, can easily be utilised via software and/or material elements.

This second example corresponds to a filtering device 1 wherein the filters $h_1$ and $h_2$ are directly instantiated "in parallel". Each elementary filtering cell $h^l_1$ of the first IIR filter $h_1$ is associated with an elementary filtering cell $h^l_2$ of the second IIR filter $h_2$ within filtering blocks $B^l$. In this way using the elementary "identity" cells PTi is avoided.

Each pair ($h^l_1$, $h^l_2$) accompanied by the respective control elements has the same properties as the pair of filtering blocks ($B^l_1$, $B^l_2$) of FIG. 1. Accordingly, switching between the two IIR filters is done in the same way.

In this configuration, L/2 pairs corresponding to L/2 filtering blocks $B^l$ are cascaded.

The output $\tilde{s}^l(n)$ of a filtering block $B^l$ is shown as follows, for $C_o=1-C_f$:

$$\tilde{s}^l(n) = \begin{cases} s_1^l(n) & n < T \\ C_f(n-T) \cdot s_1^l + (1-C_f(n-T)) \cdot s_2^l(n) & T \leq n < T+N \\ s_1^l(n) & n \geq T+N \end{cases}$$

with $$s_i^l(n) = \sum_{k=0}^{2} b_{i,l,k} \cdot \tilde{s}^{l-1}(n-k) + \sum_{k=1}^{2} a_{i,l,k} \cdot s^l(n-k)$$

at the level of each elementary filtering cell $h^l_i$ and the convention $\tilde{s}^{-1}(n)=x(n)$.

The ideas provided previously in connection with the first example are also applicable to this second example of a filtering device 1. This is the case in particular for managing a new request for IIR filter change, for the form of functions $C_f$ and $C_o$, or again the order of the elementary filtering cells.

It should be noted that in the event where the two IIR filters $h_1$ and $h_2$ have parts AR and/or MA of different orders, the number of elementary filtering cells can be different to each other. In this case, one or more elementary cells of "identity" type (PTi) is created which is associated in parallel to each supernumerary elementary filtering cell of the IIR filter having a larger number of elementary cells $h^l_1$ to form a filtering block $B^l$. Therefore, each elementary cell of the two IIR filters forms part of a filtering block.

Figure 4:
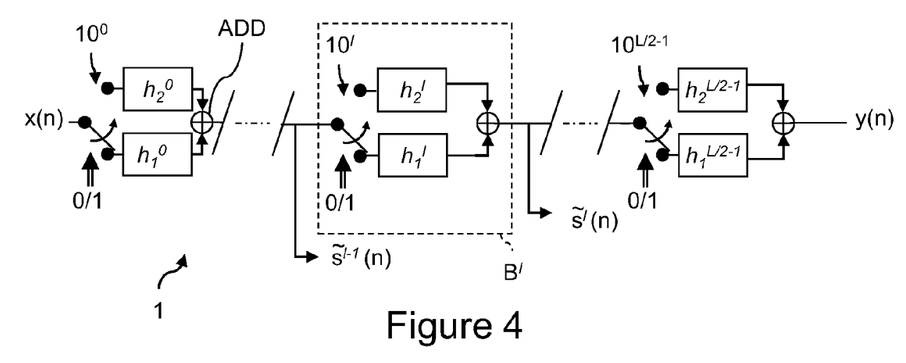
FIG. 4 schematically illustrates another embodiment of the filtering device according to the invention.

FIG. 4 schematically illustrates a degraded example of execution of the filtering device according to the invention.

In this example, the control elements $10^l_i$ and $10^l_{PTi}$ are positioned within the filter cells before the elementary filtering cells $h^l_i$ and PTi. FIG. 4 corresponds to the particular case where these control elements employ instantaneous transition ($C_f(n<T)=1$; $C_f(n \geq T)=0$), represented here by a single interrupter $10^l$.

In this case progressiveness of the switching results from the impulse response duration of the elementary filtering cells, according to which the latter continue to generate an output signal (switching off signal) even in the absence of input signal. In fact, the adder ADD combines this switching off signal with the signal filtered by the other elementary "active" cell, ensuring progressive switching.

It is however noted that the duration of progressive switching is less well controlled here than in the case of FIGS. 1 and 3, where the profile of the coefficient $C_f$ directly controls the switching duration N.

In reference again to FIG. 4, the control elements $10^l_i$ are single switches or interrupters which do not apply progressive switching. But they produce initialisation durations of the internal variables which are considerably reduced due to use of elementary filtering cells $h^l_i$ according to the invention at the level of which switching is controlled (command 0/1 shown in the figure for controlling simultaneously all the interrupters $10^l$).

This degraded embodiment can perform just as well in the "series" version of FIG. 1 as in the "parallel" version of FIG. 3.

The invention such as described hereinabove therefore reduces latency in an IIR filter change even more significantly since these IIR filters are broken down into elementary filtering cells having low orders.

Some tests have shown notable efficacy of the invention with respect to known techniques. For example, applying the invention to control switching between the IIR filters of order 4, factorised into two elementary cells of order 2, the inventors reduced by half the switching time relative to the hybrid method mentioned previously, with constant artefact energy (audio click).

The present invention has various applications in the field of digital signal processing, and especially audio signals, since the use of IIR filters varying over time is very widespread.

By way of illustration, this is the case of linear prediction coders (LPC-speech coder). In this case, the filter change LPC from one frame to the other is generally done by interpolation of coefficients. Using the present invention improves filtering stability during switching by having minimal latency and complexity.

This is also the case for acoustic shock suppressor modules. Any telephone terminal plans to integrate limiters on the loudspeaker signal the task of which is to protect the user from potential acoustic shocks (strong signals, Larsen signals, etc.). For example, these limiters are found in self-contained units for the use of representatives, in VoIP clients, in mobile terminals.

In the case of Larsen, the frequential content generally varies rapidly over time. If the frequencies which compose the Larsen over time are supposedly known, using the invention quasi instantaneously adapts the IIR filters to these frequencies and filters the Larsen effect.

Finally, it is also the case of noise reduction systems. Such systems are used in any terminal fitted with a sound pickup, especially hands-free types.

In this case, using noise reduction filters would employ filters which vary over time to adapt to the spectral content of word and/or noise. Applying the ideas of the invention to these systems especially improves the latter with respect to latency.

Figure 5:
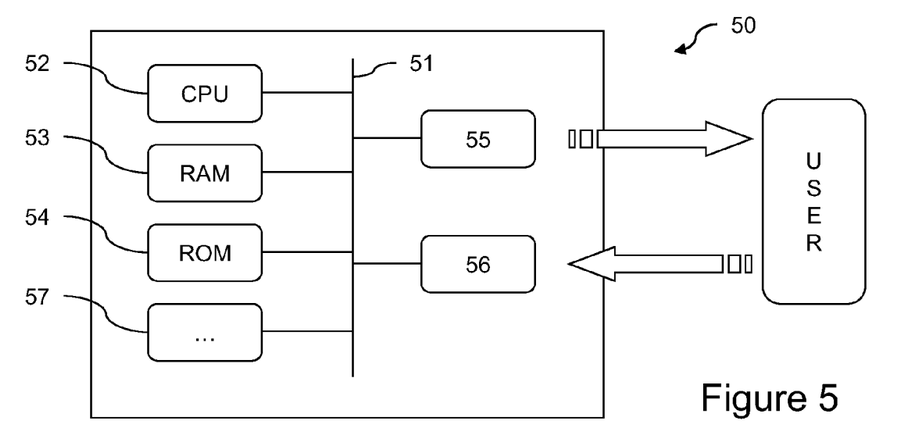
FIG. 5 shows a particular material configuration of a device or system capable of executing the process according to the invention.

FIG. 5 schematically shows a device or system 50 for executing the invention, especially equipment fitted with IIR filters and on which the filter switching is carried out.

The system 50 comprises a communications bus 51 to which are attached a central processing unit or "microprocessor" 52, live memory 53, non-volatile memory 54, a display device 55 for displaying user interfaces, a pointing device 56 and optionally other peripherals 57 (communications interface, diskette or disc reader, etc.).

The non-volatile memory 54 comprises the programs, execution of which executes the process according to the invention, and for example software definitions of IIR filters, optionally already broken down into elementary filtering cells.

During execution of programs, the executable code of these programs is loaded in live memory 53, RAM type, and executed by the microprocessor 52. This execution allows instantiation of the IIR filters and control of their activation and their switching off, that is, also of the switching from one IIR filter to the other, as shown in FIGS. 1, 3 and 4 for example.

The display device 55, such as a screen, enables display of graphic user interfaces for example allowing a user to generate activation, switching off or switching IIR filter commands.

The pointing device 56 can be integrated into the display device, especially when it is a touch screen, or remote, for example a mouse, a touch pad or a graphic tablet, to allow the user to send these commands.

The device described here and the central unit 52 in particular are likely to employ all or part of the processing described in connection with FIGS. 1 to 4 for executing the processes of the present invention and constituting the devices and systems of the present invention.

The preceding examples are only embodiments of the invention which is not limited thereto.

For example, the invention can employ only the "block" $h_1$ of FIG. 1 (left part), corresponding to the case of FIG. 3 wherein the filter $h_2$ is an identity filter (the second elementary filtering cells are also "identity" cells). Switching according to the invention switches off the filter $h_1$ for the sake of absence of filtering, without artefact or reducing it significantly.

Similarly, using only the "block" $h_2$ of FIG. 1 (right part), switching according to the invention activates the filter $h_2$ whereas initially no filtering of the digital signal was performed, without artefact or reducing it significantly.

An embodiment of the present invention eliminates at least one of the disadvantages discussed in the Background section.

The invention claimed is:

1. A process comprising:
receiving a digital signal by a filtering device comprising a plurality of first cascaded filtering blocks, each filtering block comprising a first elementary filtering cell and another associated elementary filtering cell, all of said first elementary filtering cells of the plurality of first filtering blocks being configured to factorise a first autoregressive moving average (ARMA) filter;
filtering the digital signal by the filtering device to produce a filtered digital signal, wherein filtering comprises:
receiving by a processor of the filtering device a first request for a filtering change to or from filtering by the first ARMA filter by the filtering device,
controlling at least one control element to progressively switch the filtering device between digital signal filtering by the first elementary filtering cell and digital signal filtering by said other associated elementary filtering cell at a level of each of a plurality of first cascaded filtering blocks in response to receiving the first request.

2. The process as claimed in claim 1, wherein the progressive switch at the level of a first filtering block comprises the combination of a filtered signal by the first elementary filtering cell with a filtered signal by the other associated elementary filtering cell to produce a mixed output signal of a filtering block during the progressive switch.

3. The process as claimed in claim 2, wherein said progressive switch uses fades whereof fade coefficients corresponding are applied to the signals filtered by the first elementary filtering cells and by the other elementary filtering cells.

4. The process as claimed in claim 2, wherein within each first filtering block, said other elementary filtering cell is placed in parallel with said first elementary filtering cell to which a switching coefficient is applied, and said other elementary filtering cell uses an identity filter weighted by a complementary switching coefficient.

5. The process as claimed in claim 4, wherein said plurality of first filtering blocks is placed in series with a plurality of cascaded second filtering blocks, each comprising a second elementary filtering cell originating from factorisation of a second ARMA filter placed in parallel with a cell identity filter and weighted by a switching coefficient, all of said second elementary filtering cells of the plurality of second filtering blocks factorising the second ARMA filter, and at the level of the second filtering blocks the process comprises progressive switching of filtering by the second reverse elementary cells of the progressive filtering switching by the first elementary cells at the level of the first filtering blocks to control progressive switching between filtering by the first ARMA filter and filtering by the second ARMA filter.

6. The process as claimed in claim 2, wherein within said first filtering blocks said other elementary filtering cell is placed in parallel with said first elementary filtering cell and comprises a second elementary filtering cell originating from factorisation of a second ARMA filter.

7. The process as claimed in claim 6, wherein if one of the factorisations of the first and second ARMA filters comprises more elementary filtering cells than the other, a cell filter of identity filter type is associated with each supernumerary elementary filtering cell to form said filtering block.

8. The process as claimed in claim 1, comprising, in response to a second request for filtering reverse change of the first request and received during the progressive switch, an inversion step of said filtering switching from the switching state corresponding to the instant of reception of said second request for change.

9. A filtering device for a digital signal, comprising:
a plurality of first cascaded filtering blocks, which receive the digital signal and produce a filtered digital signal, each filtering block comprising a first elementary filtering cell and another associated elementary filtering cell, all of said first elementary filtering cells of the plurality of first filtering blocks being configured to factorise a first autoregressive moving average (ARMA) filter;
at least one control element configured to control, at the level of each first filtering block, a filtering change to or from filtering by the first ARMA filter;
a processor, which is configured to:
receive a request for a filtering change to or from filtering by the first ARMA filter;
control the at least one control element to progressively switch the filtering device between digital signal filtering by the first elementary filtering cell and digital signal filtering by said other associated elementary filtering cell at a level of each of the plurality of first cascaded filtering blocks, in response to receiving the request.

10. The device as claimed in claim 9, wherein each said first filtering block comprises an adder for combining a signal filtered by the first elementary filtering cell with a signal filtered by said other associated elementary filtering cell to generate a mixed output signal of a filtering block during progressive switching.

11. The device as claimed in claim 10, wherein the at least one control element comprises progressive attenuation means of the filtered signal by the first elementary filtering cell and of the filtered signal by said associated elementary filtering cell before combination, according to two complementary fade coefficients respectively, one closing fade and the other opening fade.

12. The device as claimed in claim 9, wherein within each first filtering block said other elementary filtering cell is placed in parallel with said first elementary filtering cell to which a switching coefficient is applied and said other elementary filtering cell uses an identity filter weighted by a complementary switching coefficient.

13. The device as claimed in claim 12, wherein said plurality of first filtering blocks is placed in series of a plurality of cascaded second filtering blocks, each comprising a second elementary filtering cell originating from factorisation of a second ARMA filter placed in parallel with a cell identity filter and weighted by a switching coefficient, all of said second elementary filtering cells of the plurality of second filtering blocks factorising the second ARMA filter,
and at the level of the second filtering blocks, the device comprises control elements of progressive filtering switching by the second reverse elementary cells of the progressive filtering switching by the first elementary cells at the level of the first filtering blocks to control progressive switching between filtering by the first ARMA filter and filtering by the second ARMA filter.

14. The device as claimed in claim 9, wherein within said first filtering blocks, said other elementary filtering cell is placed in parallel with said first elementary filtering cell and comprises a second elementary filtering cell originating from factorisation of a second ARMA filter.

15. A non-transitory memory device comprising a computer program product stored thereon and readable by a microprocessor of a filtering device, the computer program product comprising instructions that configure the microprocessor to perform a process for filtering a digital signal when this program is loaded and executed by the microprocessor, wherein the process comprises:
receiving a digital signal by a filtering device comprising a plurality of first cascaded filtering blocks, each filtering block comprising a first elementary filtering cell and another associated elementary filtering cell, all of said first elementary filtering cells of the plurality of first filtering blocks being configured to factorise a first autoregressive moving average (ARMA) filter;
filtering the digital signal by the filtering device to produce a filtered digital signal, wherein filtering comprises:
the microprocessor receiving a first request for a filtering change to or from filtering by first ARMA filter by the filtering device,
at least one control element progressively switching the filtering device between digital signal filtering by the first elementary filtering cell and digital signal filtering by said other associated elementary filtering cell at a level of each of a plurality of first cascaded filtering blocks, in response to receiving the request.

* * * * *